(12) United States Patent
Friedman et al.

(10) Patent No.: US 9,638,977 B2
(45) Date of Patent: May 2, 2017

(54) PINHOLE MITIGATION FOR OPTICAL DEVICES

(71) Applicant: View, Inc., Milpitas, CA (US)

(72) Inventors: Robin Friedman, Mountain View, CA (US); Sridhar K. Kailasam, Santa Clara, CA (US); Rao Mulpuri, Saratoga, CA (US); Ronald M. Parker, Olive Branch, MS (US); Ronald A. Powell, Portola Valley, CA (US); Anshu A. Pradhan, Collierville, TN (US); Robert T. Rozbicki, Germantown, TN (US); Vinod Khosla, Portola Valley, CA (US)

(73) Assignee: View, Inc., Milpitas, CA (US)

( * ) Notice: Subject to any disclaimer, the term of this patent is extended or adjusted under 35 U.S.C. 154(b) by 22 days.

(21) Appl. No.: 14/384,146

(22) PCT Filed: Mar. 13, 2013

(86) PCT No.: PCT/US2013/031098
§ 371 (c)(1),
(2) Date: Sep. 9, 2014

(87) PCT Pub. No.: WO2013/138535
PCT Pub. Date: Sep. 19, 2013

(65) Prior Publication Data
US 2015/0077831 A1 Mar. 19, 2015

Related U.S. Application Data

(60) Provisional application No. 61/610,241, filed on Mar. 13, 2012.

(51) Int. Cl.
*G02F 1/153* (2006.01)
*G02F 1/15* (2006.01)
(Continued)

(52) U.S. Cl.
CPC .......... *G02F 1/1523* (2013.01); *B01J 19/121* (2013.01); *C03C 23/0025* (2013.01);
(Continued)

(58) Field of Classification Search
CPC ........ G02F 1/163; G02F 1/1533; G02F 1/153; G02F 2001/1515; B05D 3/12
(Continued)

(56) References Cited

U.S. PATENT DOCUMENTS 3,271,286 A 9/1966 Lepselter
3,521,941 A 7/1970 Deb et al.
(Continued)

FOREIGN PATENT DOCUMENTS

CN 1703653 A 11/2005
CN 1755437 A 4/2006
(Continued)

OTHER PUBLICATIONS

Extended European Search Report dated Sep. 21, 2015 for EP Application No. 13760591.1.
(Continued)

*Primary Examiner* — Evelyn A Lester
(74) *Attorney, Agent, or Firm* — Weaver Austin Villeneuve & Sampson LLP; Brian D. Griedel

(57) ABSTRACT

Methods, apparatus, and systems for mitigating defects in optical devices such as electrochromic devices. One method mitigates a pinhole defect in an electrochromic device by identifying the site of the pinhole defect and obscuring the pinhole to make it less visually discernible. In some cases, the pinhole defect may be the result of mitigating a short-related defect.

19 Claims, 13 Drawing Sheets

(51) Int. Cl.
*B01J 19/12* (2006.01)
*G01R 31/08* (2006.01)
*G02F 1/01* (2006.01)
*G02F 1/13* (2006.01)
*C03C 23/00* (2006.01)
*B05D 3/12* (2006.01)
*G02F 1/163* (2006.01)

(52) U.S. Cl.
CPC .......... *G01R 31/08* (2013.01); *G02F 1/0147* (2013.01); *G02F 1/1309* (2013.01); *G02F 1/15* (2013.01); *G02F 1/153* (2013.01); *B05D 3/12* (2013.01); *G02F 1/1533* (2013.01); *G02F 1/163* (2013.01); *G02F 2001/1515* (2013.01); *G02F 2201/508* (2013.01); *Y10T 156/10* (2015.01)

(58) Field of Classification Search
USPC ........ 359/275; 250/492.1; 427/58, 555, 553; 156/60, 272.8
See application file for complete search history.

(56) References Cited

U.S. PATENT DOCUMENTS

| | | | |
|---|---|---|---|
| 3,652,929 | A | 3/1972 | Cushman |
| 4,166,918 | A | 9/1979 | Nostrand et al. |
| 4,293,194 | A | 10/1981 | Takahashi |
| 4,309,082 | A | 1/1982 | Kohara et al. |
| 4,543,171 | A | 9/1985 | Firester et al. |
| 4,570,046 | A | 2/1986 | Melanson et al. |
| 4,806,496 | A | 2/1989 | Suzuki et al. |
| 4,937,423 | A | 6/1990 | Yoshihara et al. |
| 5,011,582 | A | 4/1991 | Oshikawa et al. |
| 5,017,755 | A | 5/1991 | Yahagi et al. |
| 5,202,788 | A | 4/1993 | Weppner |
| 5,290,986 | A | 3/1994 | Colon et al. |
| 5,747,770 | A | 5/1998 | Bogart |
| 5,907,383 | A | 5/1999 | Kurihara et al. |
| 6,225,640 | B1 | 5/2001 | Glenn et al. |
| 6,228,662 | B1 | 5/2001 | Hayashi et al. |
| 6,750,662 | B1 | 6/2004 | Van Der Heide |
| 6,834,158 | B1 | 12/2004 | Templeton |
| 6,878,900 | B2 | 4/2005 | Corkum et al. |
| 7,001,540 | B2 * | 2/2006 | Kloeppner .............. C09K 9/02 252/583 |
| 7,531,101 | B2 | 5/2009 | Beteille |
| 8,045,146 | B2 | 10/2011 | Saito et al. |
| 8,300,298 | B2 | 10/2012 | Wang et al. |
| 8,432,603 | B2 | 4/2013 | Wang et al. |
| 8,582,193 | B2 | 11/2013 | Wang et al. |
| 8,764,950 | B2 | 7/2014 | Wang et al. |
| 8,764,951 | B2 | 7/2014 | Wang et al. |
| 8,929,406 | B2 | 1/2015 | Chuang et al. |
| 9,507,232 | B2 | 11/2016 | Rozbicki et al. |
| 2003/0081201 | A1 | 5/2003 | Shibata et al. |
| 2003/0111447 | A1 | 6/2003 | Corkum et al. |
| 2004/0101981 | A1 | 5/2004 | Morishita |
| 2006/0001801 | A1 | 1/2006 | Kim et al. |
| 2006/0098264 | A1 | 5/2006 | Park |
| 2006/0193031 | A1 | 8/2006 | Moore |
| 2006/0197462 | A1 | 9/2006 | Uchiyama et al. |
| 2007/0081151 | A1 | 4/2007 | Shortt |
| 2007/0092129 | A1 | 4/2007 | Sugiyama et al. |
| 2007/0097481 | A1 | 5/2007 | Burdis et al. |
| 2007/0141360 | A1 | 6/2007 | Beteille |
| 2007/0289768 | A1 | 12/2007 | Moore et al. |
| 2008/0128286 | A1 | 6/2008 | Wu et al. |
| 2008/0304130 | A1 | 12/2008 | Nguyen |
| 2008/0304131 | A1 | 12/2008 | Nguyen |
| 2009/0279079 | A1 | 11/2009 | Shibata et al. |
| 2010/0074515 | A1 | 3/2010 | Zhao et al. |
| 2010/0243427 | A1 | 9/2010 | Kozlowski et al. |
| 2010/0245973 | A1 * | 9/2010 | Wang .................. C03C 17/3417 359/275 |
| 2011/0048614 | A1 | 3/2011 | Veerasamy |
| 2012/0026573 | A1 | 2/2012 | Collins et al. |
| 2012/0030121 | A1 | 2/2012 | Grellier |
| 2012/0302121 | A1 | 11/2012 | Sbar et al. |
| 2013/0092679 | A1 | 4/2013 | Rozbicki |
| 2013/0258436 | A1 | 10/2013 | Podbelski |
| 2013/0306615 | A1 | 11/2013 | Rozbicki et al. |
| 2015/0097944 | A1 * | 4/2015 | Palm ..................... G01N 25/72 348/129 |
| 2015/0108102 | A1 | 4/2015 | Martin |
| 2017/0003566 | A1 | 1/2017 | Friedman et al. |
| 2017/0044057 | A1 | 2/2017 | Rozbicki et al. |

FOREIGN PATENT DOCUMENTS

| | | |
|---|---|---|
| CN | 101274391 A | 10/2008 |
| CN | 101697040 A | 4/2010 |
| EP | 0958882 A2 | 11/1999 |
| EP | 2036652 A1 | 3/2009 |
| JP | S56-35125 A | 4/1981 |
| JP | S58-93591 A | 6/1983 |
| JP | H07-028099 A | 1/1995 |
| JP | H10-58169 A | 3/1998 |
| JP | 2001-066418 | 3/2001 |
| JP | 2007-205724 | 8/2007 |
| JP | 2009-198230 | 9/2009 |
| KR | 10-2007-0099216 A | 10/2007 |
| KR | 10-0838656 | 6/2008 |
| KR | 10-2011-0084703 A | 7/2011 |
| KR | 10-2012-0127171 A | 11/2012 |
| TW | 201116918 A | 5/2011 |
| WO | WO 2004/034138 A1 | 4/2004 |
| WO | WO 2010-120535 A2 | 10/2010 |
| WO | WO 2012-154320 A1 | 11/2012 |
| WO | WO 2013-039915 A1 | 3/2013 |
| WO | WO 2013/138535 A1 | 9/2013 |
| WO | WO 2013/173591 A1 | 11/2013 |

OTHER PUBLICATIONS

U.S. Appl. No. 13/610,612, filed Sep. 11, 2012.
U.S. Appl. No. 12/336,466, filed Dec. 16, 2008.
U.S. Appl. No. 13/859,623, filed Apr. 9, 2013.
U.S. Office Action dated Jun. 12, 2012 in U.S. Appl. No. 12/336,466.
U.S. Final Office Action dated Oct. 30, 2012 in U.S. Appl. No. 12/336,466.
U.S. Office Action dated Sep. 13, 2013 in U.S. Appl. No. 12/336,466.
U.S. Office Action dated May 9, 2014 in U.S. Appl. No. 12/336,466.
International Search Report dated Jan. 31, 2013 in Application No. PCT/US2012/054665.
International Search Report dated Aug. 4, 2014 in Application No. PCT/US2014/033059.
U.S. Appl. No. 15/283,151 filed Sep. 30, 2016, entitled Portable Defect Mitigator for Electrochromic Windows.
U.S. Appl. No. 15/252,099 entitled Pinhole Mitigation for Optical Devices filed Aug. 30, 2016.
Preliminary Amendment filed Sep. 19, 2016 in U.S. Appl. No. 15/252,099.
U.S. Office Action dated Feb. 8, 2016 in U.S. Appl. No. 13/610,612.
U.S. Notice of Allowance dated Jul. 19, 2016 in U.S. Appl. No. 13/610,612.
U.S. Notice of Allowance dated Sep. 14, 2016 (supplemental) in U.S. Appl. No. 13/610,612.
US Office Action dated Mar. 24, 2016 in U.S. Appl. No. 13/859,623.
U.S. Final Office Action dated Mar. 18, 2015 in U.S. Appl. No. 12/336,466.
U.S. Office Action dated Jul. 5, 2016 in U.S. Appl. No. 12/336,466.
International Preliminary Report on Patentability dated Mar. 27, 2014 in PCT Application No. PCT/US2012/054665.
International Preliminary Report on Patentability dated Jul. 29, 2015 in PCT Application No. PCT/US2014/033059.
International Search Report dated Jun. 4, 2013 in PCT Application No. PCT/US2013/031098.

(56) References Cited

OTHER PUBLICATIONS

International Preliminary Report on Patentability dated Sep. 25, 2014 in PCT Application No. PCT/US2013/031098.
International Search Report and Written Opinion for PCT/US2013/041365 dated Aug. 27, 2013.
International Preliminary Report on Patentability for PCT/US2013/041365 dated Nov. 27, 2014.
EP Extended Search Report dated Jun. 18, 2015 for EP Application No. 12832253.4.
EP Office Action dated Oct. 7, 2016 in EP Application No. 13760591.1.
EP Partial Supplementary Search Report dated Jan. 25, 2016 for EP Application No. 13791156.6.
EP Extended Search Report dated May 13, 2016 for EP Application No. 13791156.6.
CN Office Action dated Oct. 13, 2015 in CN Application No. 201380025529.2.
CN Office Action dated Aug. 31, 2016 in CN Application No. 201380025529.2.
TW Office Action dated Apr. 8, 2016 in TW Application No. 101133555.
US Office Action dated Jan. 6, 2017 in U.S. Appl. No. 13/859,623.
U.S. Final Office Action dated Mar. 14, 2017 in U.S. Appl. No. 12/336,466.

* cited by examiner

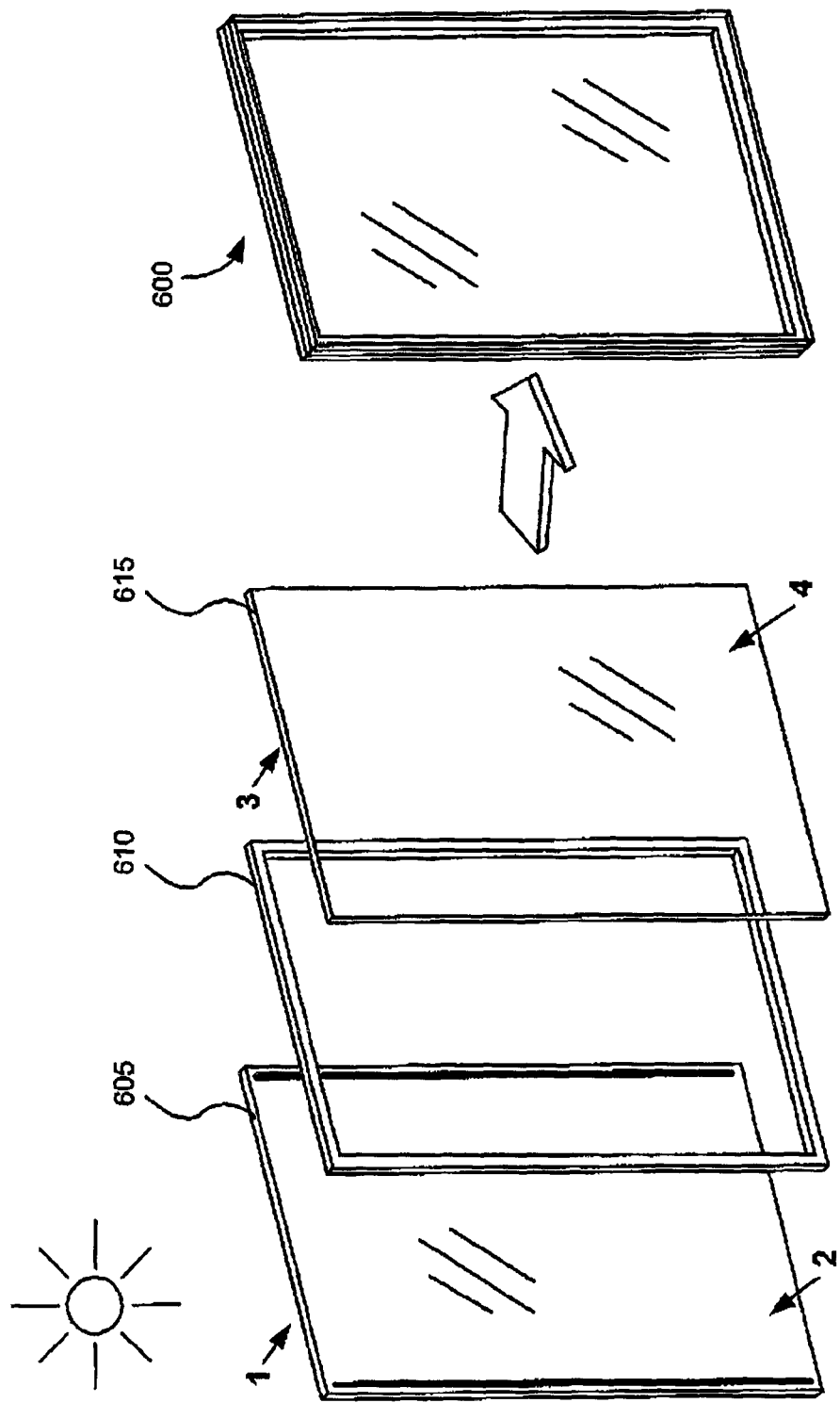

PINHOLE MITIGATION FOR OPTICAL DEVICES

CROSS-REFERENCES TO RELATED APPLICATIONS

This application is a national stage application under 35 U.S.C. §371 to International PCT Application No. PCT/US13/31098 (designating the United States), filed on Mar. 13, 2013 and titled "PINHOLE MITIGATION FOR OPTICAL DEVICES," which claims priority to and benefit of U.S. Provisional Patent Application No. 61/610,241, filed on Mar. 13, 2012 and titled "PINHOLE MITIGATION FOR OPTICAL DEVICES." All of these applications are incorporated herein by reference in their entireties and for all purposes.

FIELD

Embodiments disclosed herein relate generally to optical devices, and more particularly to methods and apparatus related to mitigation of pinhole defects in optical devices, for example, electrochromic windows.

BACKGROUND

While electrochromism was discovered in the 1960s, electrochromic devices still unfortunately suffer various problems and have not begun to realize their full commercial potential. Electrochromic materials may be incorporated into, for example, windows. Electrochromic windows show great promise for revolutionizing the energy sector by affording huge energy savings, e.g., by controlling solar heat gain in buildings.

Advancements in electrochromic device technology have increased dramatically in recent years including ever lower levels of defectivity in the electrochromic device. This is important as defects often manifest themselves as visually discernible, and thus unattractive, phenomenon to the end user. Still, even with improved manufacturing methods, electrochromic windows have some level of defectivity. Moreover, even if an electrochromic window is manufactured with no visible defects, such visible defects may manifest themselves after the window is installed.

One particularly troublesome defect is an electrically short circuiting defect in an electrochromic window. There are existing methods of minimizing the visual size of shorting defects, but still there remains a perceptible defect, though small.

SUMMARY

Herein are described methods and apparatus for mitigating pinhole defects in optical devices, particularly in switchable electrochromic windows. Certain embodiments include applying a material to the electrochromic window to obscure the pinhole defects. Embodiments may include changing the nature of the material in the electrochromic device, proximate the pinhole, to obscure the pinhole. Methods described herein may be performed on an electrochromic device of an electrochromic lite prior to incorporation into an insulated glass unit (IGU), after incorporation into an IGU (or laminate), or both.

Various methods herein can be applied to virtually any optical device that includes a material that can be isolable locally or where the defect is stationary. In some instances, the methods can be implemented on optical devices that have liquid components, as long as the optical defect to be obscured is stationary on the device. Using methods described herein, virtually no visually discernible defects remain to the observer on the optical device.

These and other features and advantages will be described in further detail below, with reference to the associated drawings.

BRIEF DESCRIPTION OF THE DRAWINGS

The following detailed description can be more fully understood when considered in conjunction with the drawings in which:

FIG. 6A depicts a perspective exploded view of an IGU assembly having an electrochromic device on surface 2 of the IGU.

DETAILED DESCRIPTION

For the purposes of brevity, embodiments described below are done so in terms of an electrochromic lite, either alone or incorporated into an IGU or laminate. One of ordinary skill in the art would appreciate that methods and apparatus described herein can be used for virtually any optical device where a contrast exists between a pinhole defect and the colored optical device. For context, a description of electrochromic devices and defectivity in electrochromic devices is presented below. For convenience, solid state and inorganic electrochromic devices are described; however, the embodiments disclosed herein are not limited in this way.

Electrochromic Devices

Figure 1A:
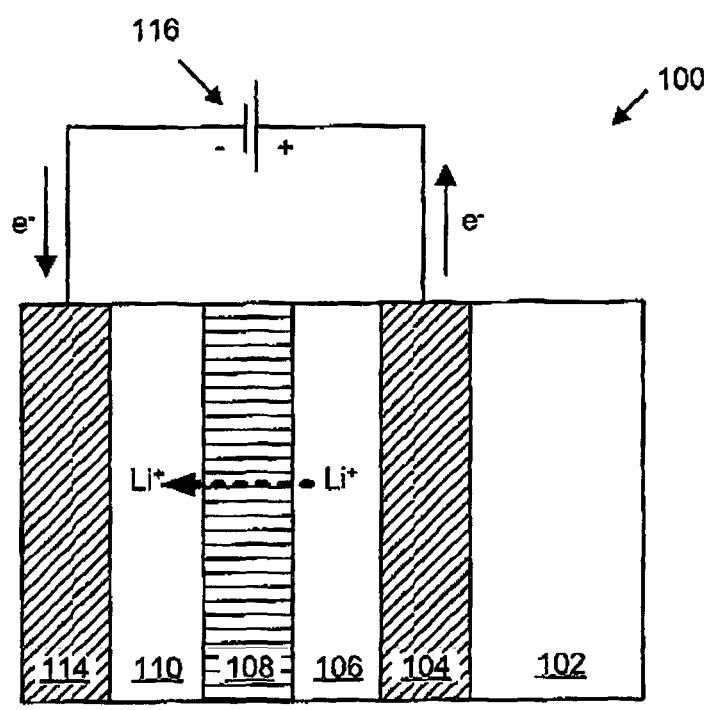
FIG. 1A is a schematic cross-section of an electrochromic device in a bleached state.

FIG. 1A depicts a schematic cross-section of an electrochromic lite, 100. Electrochromic lite 100 includes a transparent substrate, 102, a conductive layer, 104, an electrochromic layer (EC layer), 106, an ion conducting layer (IC layer), 108, a counter electrode layer (CE layer), 110, and a conductive layer (CL layer), 114. The stack of layers 104, 106, 108, 110, and 114 are collectively referred to as an electrochromic device or coating. This is a typical, though non-limiting, construct of an electrochromic device. A voltage source, 116, typically a low voltage source operable to apply an electric potential across the electrochromic stack, effects the transition of the electrochromic device from, for example, a bleached state to a colored state. In FIG. 1A, the bleached state is depicted, e.g., the EC and CE layers 106 and 110 are not colored, but rather transparent. The order of layers can be reversed with respect to the substrate. Some electrochromic devices will also include a capping layer to protect conductive layer 114, this capping layer may be a polymer and/or an additional transparent substrate such as glass or plastic. In some embodiments, the electrochromic lite is laminated to a mate lite, e.g. made of glass or other material, tinted or not. In some electrochromic devices, one of the conducting layers is a metal to impart reflective properties to the device. In many instances, both conductive layers 114 and 104 are transparent, e.g. transparent conductive oxides (TCOs), like indium tin oxide, fluorinated tin oxide, zinc oxides and the like. Substrate 102 is typically of a transparent or substantially transparent material, e.g. glass or a plastic material.

Certain electrochromic devices employ electrochromic and counter electrode (ion storage) layers that are complementarily coloring. For example, the ion storage layer 110 may be anodically coloring and the electrochromic layer 106 cathodically coloring. For the electrochromic device in lite 100, in the bleached state as depicted, when the applied voltage is applied in one direction as depicted, ions, for example, lithium ions are intercalated into ion storage layer 110, and the ion storage layer 110 is bleached. Likewise when the lithium ions move out of electrochromic layer 106, it also bleaches, as depicted. The ion conducting layer 108 allows movement of ions through it, but it is electrically insulating, thus preventing short circuiting the device between the conducting layers (and electrodes formed therefrom).

Electrochromic devices, e.g. those having distinct layers as described above, can be fabricated as all solid state and inorganic devices with low defectivity. Such all solid-state and inorganic electrochromic devices, and methods of fabricating them, are described in more detail in U.S. patent application Ser. No. 12/645,111, entitled, "Fabrication of Low-Defectivity Electrochromic Devices," filed on Dec. 22, 2009 and naming Mark Kozlowski et al. as inventors, and in U.S. patent application Ser. No. 12/645,159, entitled, "Electrochromic Devices," filed on Dec. 22, 2009 and naming Zhongchun Wang et al. as inventors, both of which are hereby incorporated by reference in their entirety.

It should be understood that the reference to a transition between a bleached state and colored state is non-limiting and suggests only one example, among many, of an electrochromic transition that may be implemented. Unless otherwise specified herein, whenever reference is made to a bleached-colored transition, the corresponding device or process encompasses other optical state transitions such non-reflective-reflective, transparent-opaque, etc. Further the term "bleached" refers to an optically neutral state, for example, uncolored, transparent or translucent. Still further, unless specified otherwise herein, the "color" of an electrochromic transition is not limited to any particular wavelength or range of wavelengths. As understood by those of skill in the art, the choice of appropriate electrochromic and counter electrode materials governs the relevant optical transition.

Any material having suitable optical, electrical, thermal, and mechanical properties may be used as substrate 102. Such substrates include, for example, glass, plastic, and mirror materials. Suitable plastic substrates include, for example, acrylic, polystyrene, polycarbonate, allyl diglycol carbonate, SAN (styrene acrylonitrile copolymer), poly(4-methyl-1-pentene), polyester, polyamide, etc. If a plastic substrate is used, it is preferably barrier protected and abrasion protected using a hard coat of, for example, a diamond-like protection coating, a silica/silicone anti-abrasion coating, or the like, such as is well known in the plastic glazing art. Suitable glasses include either clear or tinted soda lime glass, including soda lime float glass. The glass may be untempered, strengthened (by heat or chemically) or otherwise tempered. An electrochromic lite with glass, for example soda lime glass, used as a substrate may include a sodium diffusion barrier layer between the soda glass and the device to prevent diffusion of sodium ions from the glass into the device. Both glass and plastic substrates are compatible with embodiments described herein, so long as their properties are accounted for in the methods described. This is explained in further detail below.

Figure 1B:
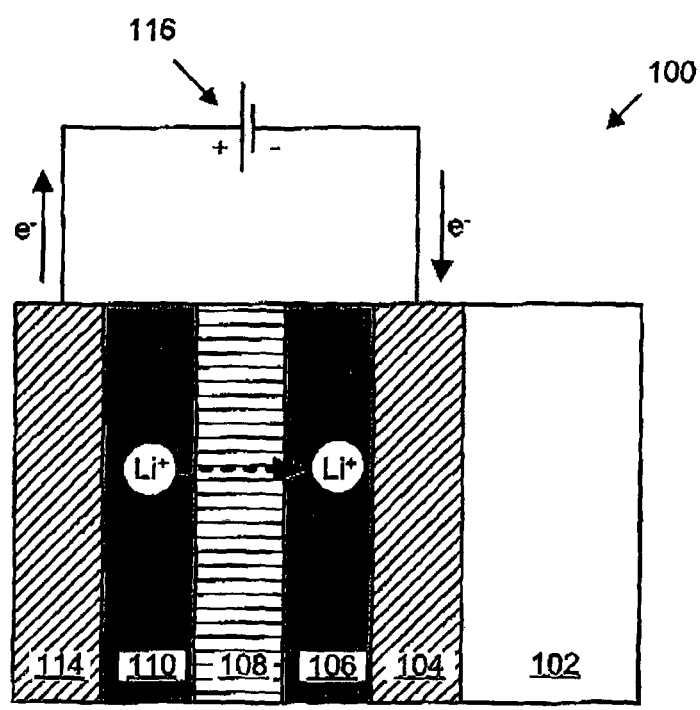
FIG. 1B is a schematic cross-section of an electrochromic device in a colored state.

FIG. 1B is a schematic cross-section of electrochromic lite 100 shown in FIG. 1A but with the electrochromic device in a colored state (or transitioning to a colored state). In FIG. 1B, the polarity of voltage source 116 is reversed, so that the electrochromic layer 106 is made more negative to accept additional lithium ions, and thereby transition to the colored state; while at the same time lithium ions leave the counter electrode or ion storage layer 110, and it also colors. As indicated by the dashed arrow, lithium ions are transported across ion conducting layer 108 to electrochromic layer 106. Exemplary materials that color complimentarily in this fashion are tungsten oxide (electrochromic layer) and nickel-tungsten oxide (counter electrode layer).

Certain electrochromic devices may include reflective materials in one or both electrodes in the device. For example, an electrochromic device may have one electrode that colors anodically and one electrode that becomes reflective cathodically. Such devices are compatible with embodiments described herein so long as the reflective nature of the device is taken into account. This is explained in more detail below.

The all solid state and inorganic electrochromic devices described above have low defectivity and high reliability, and thus are well suited for electrochromic windows, particularly those with large format architectural glass substrates.

Not all electrochromic devices have a distinct ion conducting layer as depicted in FIGS. 1A and 1B. As conventionally understood, the ionically conductive layer prevents shorting between the electrochromic layer and the counter electrode layer. The ionically conductive layer allows the electrochromic and counter electrodes to hold a charge and thereby maintain their bleached or colored states. In electrochromic devices having distinct layers, the components form a stack which includes the ion conducting layer sandwiched between the electrochromic electrode layer and the counter electrode layer. The boundaries between these three stack components are defined by abrupt changes in composition and/or microstructure. Thus, such devices have three distinct layers with two abrupt interfaces.

Quite surprisingly, it has been discovered that high quality electrochromic devices can be fabricated without depositing a distinct ionically conducting electrically insulating layer. In accordance with certain embodiments, the counter electrode and electrochromic electrodes are formed immediately adjacent one another, without separately depositing an ionically conducting layer. It is believed that various fabrication processes and/or physical or chemical mechanisms produce an interfacial region between adjacent electrochromic and counter electrode layers, and that this interfacial region serves at least some functions of a distinct ionically conductive electronically insulating layer. Such devices with such an interfacial region, and methods of fabricating such devices, are described in U.S. patent application Ser. No. 12/772,055, filed on Apr. 30, 2010 (now U.S. Pat. No. 8,300,298), U.S. patent application Ser. No. 12/772,075, filed on Apr. 30, 2010, and in U.S. patent application Ser. Nos. 12/814,277 and 12/814,279, each filed on Jun. 11, 2010—each of the four applications is entitled "Electrochromic Devices," each names Zhongchun Wang et al. as inventors, and each is hereby incorporated by reference in their entirety. A brief description of these devices follows.

Figure 2:
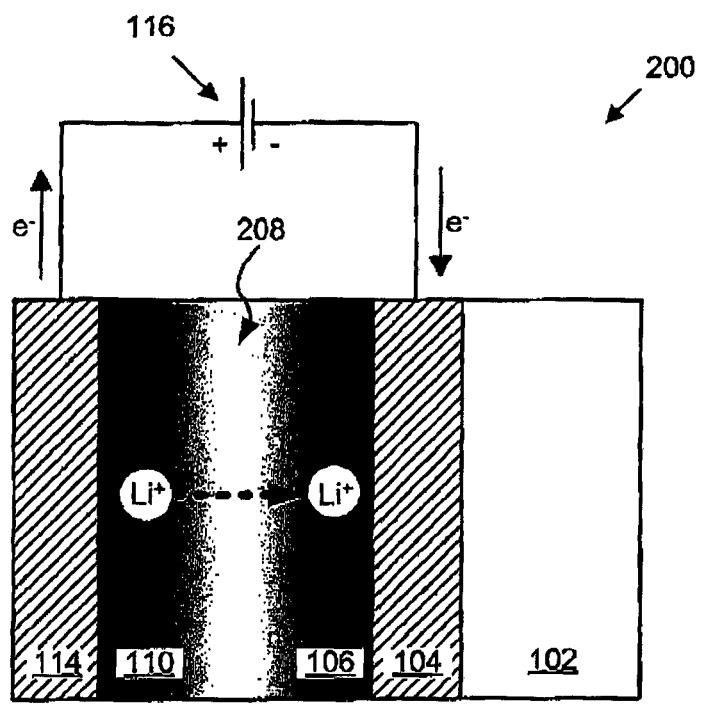
FIG. 2 is a schematic cross-section of an electrochromic device having an ion conducting electronically insulating interfacial region rather than a distinct IC layer.

FIG. 2 is a schematic cross-section of an electrochromic lite, 200, having an electrochromic device in a colored state, where the device has an ion conducting electronically insulating interfacial region, 208, serving the function of a distinct IC layer. Voltage source 116, conductive layers 114 and 104, and substrate 102 are essentially the same as described in relation to FIGS. 1A and 1B. Between conductive layers 114 and 104 is a graded region, which includes counter electrode layer 110, electrochromic layer 106 and an ion conducting electronically insulating interfacial region, 208, between them, rather than a distinct IC layer. In this example, there is no distinct boundary between counter electrode layer 110 and interfacial region 208, nor is there a distinct boundary between electrochromic layer 106 and interfacial region 208. Collectively, regions 110, 208 and 106 may be thought of as a continuous graded region. There is a diffuse transition between CE layer 110 and interfacial region 208, and between interfacial region 208 and EC layer 106. Conventional wisdom was that each of the three layers should be laid down as distinct, uniformly deposited and smooth layers to form a stack. The interface between each layer should be "clean" where there is little intermixing of materials between adjacent layers at the interface. One of ordinary skill in the art would recognize that in a practical sense there is inevitably some degree of material mixing at layer interfaces, but the point is, in conventional fabrication methods any such mixing is unintentional and minimal. The inventors of this technology found that interfacial regions serving as IC layers can be formed where the interfacial region includes significant quantities of one or more electrochromic and/or counter electrode materials by design. This is a radical departure from conventional fabrication methods.

The all solid state and inorganic electrochromic devices described above have low defectivity and high reliability. However, defects can still occur. For context, visually discernible defects in electrochromic devices are described below in relation to conventional layered stack type electrochromic devices so as to more fully understand the nature of the embodiments disclosed herein. Embodiments described herein apply to other electrochromic devices such as those employing organic polymers, laminated devices, and the like, as well as other optical devices, so long as there is a pinhole type defect that can be obscured.

Visible Defects in Electrochromic Devices

As used herein, the term "defect" refers to a defective point or region of an electrochromic device. Defects may be characterized as visible or non-visible. Often a defect will be manifest as a visually discernible anomaly in the electrochromic window or other device. Such defects are referred to herein as "visible" defects. Typically, these defects are visible when the electrochromic device is transitioned to the tinted state due to the contrast between the normally operating device area and an area that is not functioning properly, e.g., there is more light coming through the device in the area of the defect. Other defects are so small that they are not visually noticeable to the observer in normal use. For example, such defects do not produce a noticeable light point when the device is in the colored state during daytime. A "short" is a localized electronically conductive pathway spanning the ion conducting layer or region (supra), for example, an electronically conductive pathway between the two transparent conductive oxide layers.

In some cases, an electrical short is created by an electrically-conductive particle lodging in the ion conducting layer, creating an electronic path between the counter electrode and the electrochromic layer or the conductive layer associated with either one of them. In some other cases, a defect is caused by a particle on the substrate (on which the electrochromic stack is fabricated) and such a particle causes layer delamination (sometimes called "pop-off") where the layers do not adhere properly to the substrate. A delamination or pop-off defect can lead to a short if it occurs before a conductive layer or associated EC or CE is deposited. In such cases, the subsequently deposited conductive layer or EC/CE layer will directly contact an underlying conductive layer or CE/EC layer providing direct electronic conductive pathway. Both types of defects are illustrated below in FIGS. 3 and 4A-4C.

Figure 3:
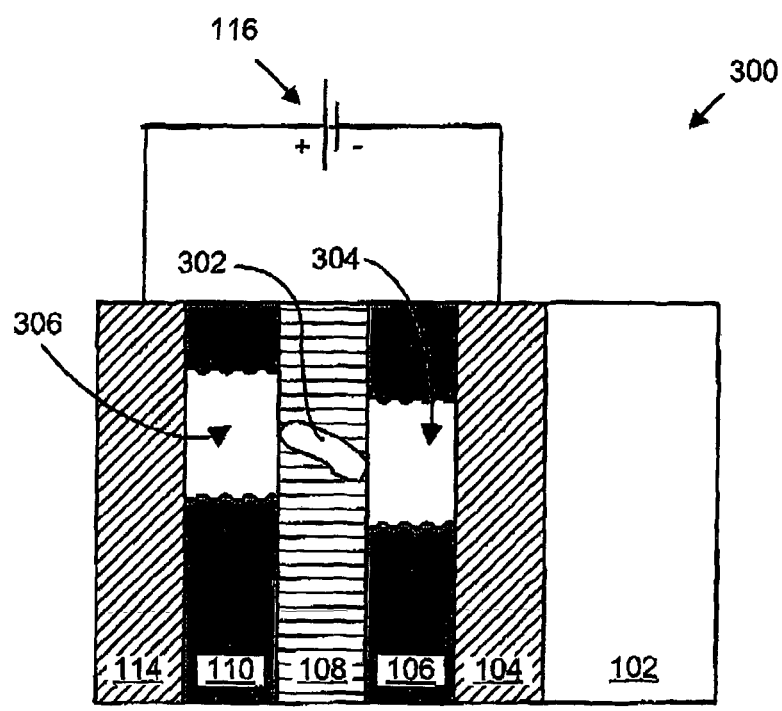
FIG. 3 is a schematic cross-section of an electrochromic device with a particle in the ion conducting layer causing a localized defect in the device.

FIG. 3 is a schematic cross-section of an electrochromic lite 300 having an electrochromic device with a particle, 302, in and spanning the ion conducting layer causing a localized shorting defect in the device. The electrochromic device in lite 300 is depicted with typical distinct layers, although particles in this size regime would cause visual defects in electrochromic devices employing ion conducting electronically insulating interfacial regions as well. Electrochromic device of lite 300 includes the same components as the electrochromic device depicted in FIG. 1A. In ion conducting layer 108 of the electrochromic device of lite 300, however, there is a conductive particle 302 or other artifact causing a defect. Conductive particle 302 results in a short between electrochromic layer 106 and counter electrode layer 110. This short affects the device locally in two ways: 1) it physically blocks the flow of ions between electrochromic layer 106 and counter electrode layer 110, and 2) it provides an electrically conductive path for electrons to pass locally between the layers, resulting in a transparent region 304 in the electrochromic layer 106 and a transparent region 306 in the counter electrode layer 110, when the remainder of layers 110 and 106 are in the colored state. That is, if electrochromic device of lite 300 is in the colored state, where both electrochromic layer 106 and ion storage layer 110 are supposed to be colored, conductive particle 302 renders regions 304 and 306 of the electrochromic device unable to enter into the colored state. These defect regions are sometimes referred to a "halos" or "constellations" because they appear as a series of bright spots or stars against a dark background (the remainder of the device being in the colored state). Humans will naturally direct their attention to halos due to the high contrast of halos against a colored window and often find them distracting and/or unattractive. As mentioned above, visible shorts can be formed in other ways.

Figure 4A:
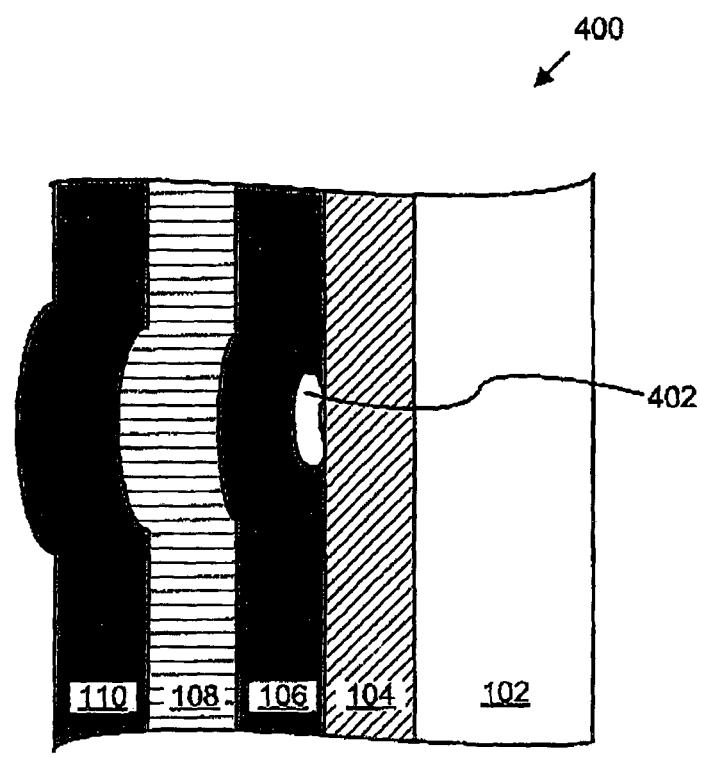
FIG. 4A is a schematic cross-section of an electrochromic device with a particle on the conductive layer prior to depositing the remainder of the electrochromic stack.

FIG. 4A is a schematic cross-section of an electrochromic lite, 400, having an electrochromic device with a particle, 402, or other debris on conductive layer 104 prior to depositing the remainder of the electrochromic stack. Electrochromic device of lite 400 includes the same components as electrochromic device of lite 100. Particle 402 causes the layers in the electrochromic device stack to bulge in the region of particle 402, due to conformal layers 106-110 being deposited sequentially over particle 402 as depicted (in this example, transparent conductor layer 114 has not yet been deposited). While not wishing to be bound by a particular theory, it is believed that layering over such particles, given the relatively thin nature of the layers, can cause stress in the area where the bulges are formed. More particularly, in each layer, around the perimeter of the bulged region, there can be defects in the layer, for example in the lattice arrangement or on a more macroscopic level, cracks or voids. One consequence of these defects would be, for example, an electrical short between electrochromic layer 106 and counter electrode layer 110 or loss of ion conductivity in ion conducting layer 108. These defects are not depicted in FIG. 4A, however.

Figure 4B:
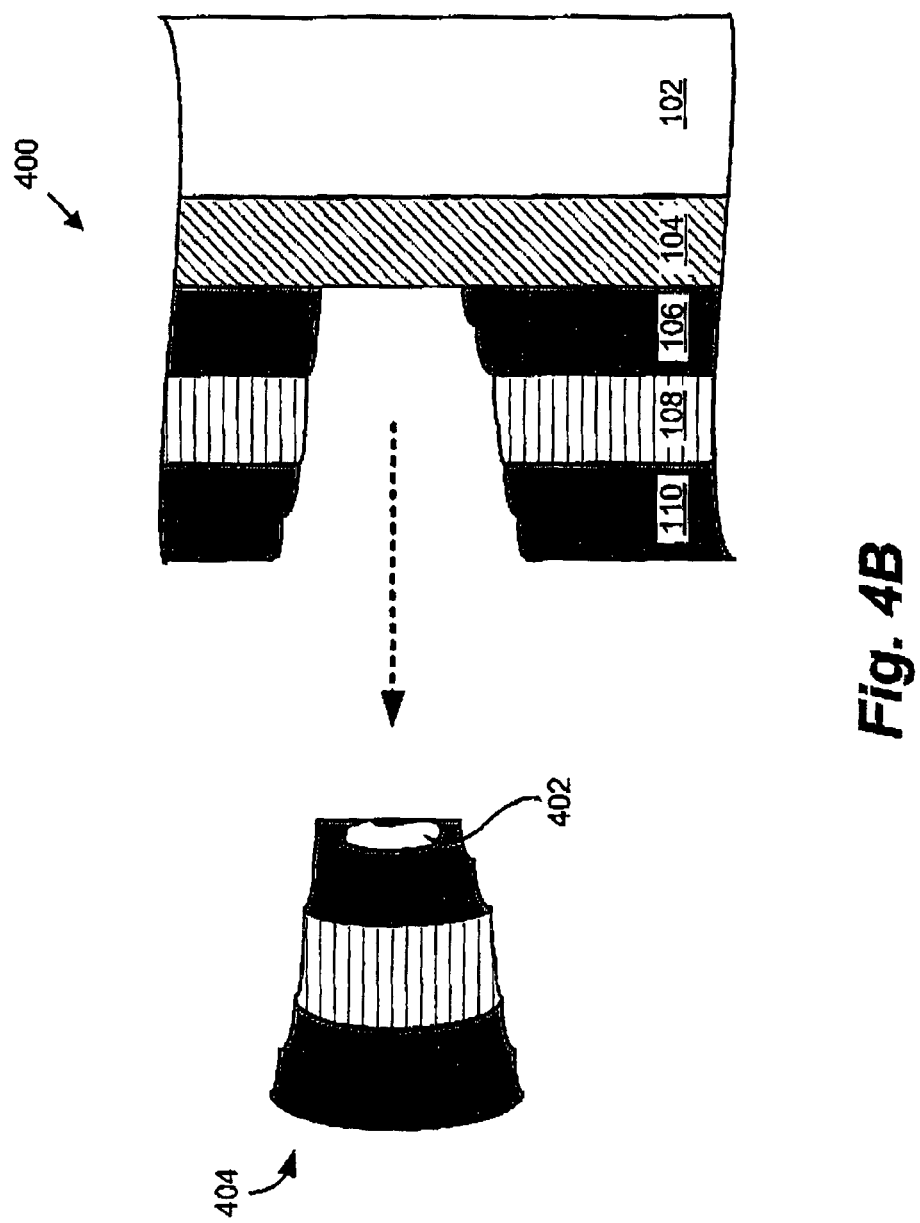
FIG. 4B is a schematic cross-section of the electrochromic device of FIG. 4A, where a "pop off" defect is formed during electrochromic stack formation.
Figure 4C:
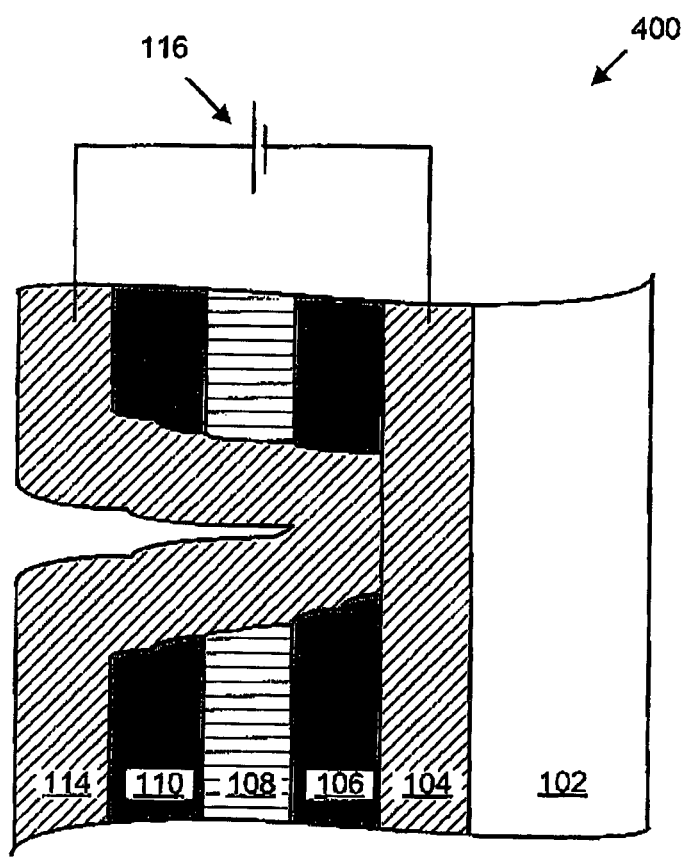
FIG. 4C is a schematic cross-section of the electrochromic device of FIG. 4B, showing an electrical short that is formed from the pop off defect once the second conductive is deposited.

Referring to FIG. 4B, another defect that may be caused by particle 402 is called a "pop-off." In this example, prior to deposition of conductive layer 114, a portion above the conductive layer 104 in the region of particle 402 breaks loose, carrying with it portions of electrochromic layer 106, ion conducting layer 108, and counter electrode layer 110. The "pop-off" portion is piece 404, which includes particle 402, a portion of electrochromic layer 106, as well as ion conducting layer 108 and counter electrode layer 110. The result is an exposed area of conductive layer 104. Referring to FIG. 4C, after the "pop-off" and once conductive layer 114 is deposited, an electrical short may be formed where conductive layer 114 comes in contact with conductive layer 104. This electrical short would leave a transparent region or halo in the electrochromic device of lite 400 when it is in the colored state, similar in appearance to the defect created by the short described above in relation to FIG. 3.

Typically, a defect causing a visible short will have a physical dimension of about 3 micrometers, sometimes less, which is a relatively small defect from a visual perspective. However, these relatively small defects result in a visual anomaly, the halo, in the colored electrochromic window that are, for example, about 1 cm in diameter, sometimes larger. Halos can be reduced significantly by isolating the defect, for example circumscribing the defect via laser scribe or by ablating the material directly without circumscribing it. For example, a circular, oval, triangular, rectangular, or other shaped perimeter is ablated around the shorting defect thus electrically isolating it from the rest of the functioning device. The circumscription may be only tens, a hundred or up to a few hundred microns in diameter. By circumscribing the defect, and thus electrically isolating the defect, the visible short will resemble only a small point of light to the naked eye when the electrochromic window is colored and there is sufficient light on the other side of the window. When ablated directly, without circumscription, there remains no electrochromic device material in the area where the electrical short defect once resided. Rather, there is a hole in the device and the base of the hole is, e.g., the float glass or the diffusion barrier or the lower transparent electrode material, or a mixture thereof. Since these materials are all transparent, light may pass through the base of the hole in the electrochromic device.

Depending on the diameter of a circumscribed defect, and the width of the laser beam, circumscribed pinholes may also have little to no electrochromic device material remaining within the circumscription (as the circumscription is typically, though not necessarily, made as small as possible). Such mitigated short defects manifest as pin points of light against the colored device, thus these points of light are commonly referred to as "pinholes." Isolation of an electrical short by circumscribing or direct ablation would be an example of a man-made pinhole, one purposely formed to convert a halo into a much smaller visual defect. However, pinholes may also arise as a natural result of defects in the electrochromic device.

Generally, a pinhole is a region where one or more layers of the electrochromic device are missing or damaged so that electrochromism is not exhibited. Although pinholes may naturally occur as a result of defects in an electochromic device, pinholes are not themselves electrical shorts, and, as described above, they may be the result of mitigating an electrical short in the device. A pinhole may have a defect dimension of between about 25 micrometers and about 300 micrometers, typically between about 50 micrometers and about 150 micrometers, and thus is much harder to discern visually than a halo. Typically, in order to reduce the visible perception of pinholes resulting from mitigation of halos, one will limit the size of a purposely-created pinhole to about 100 micrometers or less. However, embodiments described herein allow pinholes to be larger because the pinholes are obscured from view. One aspect of the embodiments disclosed herein is to reduce, if not eliminate, the number of visual defects the end user actually observes, particularly, to obscure pinholes, whether naturally occurring or purposely made from mitigation of halos. Various embodiments are described in more detail below.

Figure 5A:
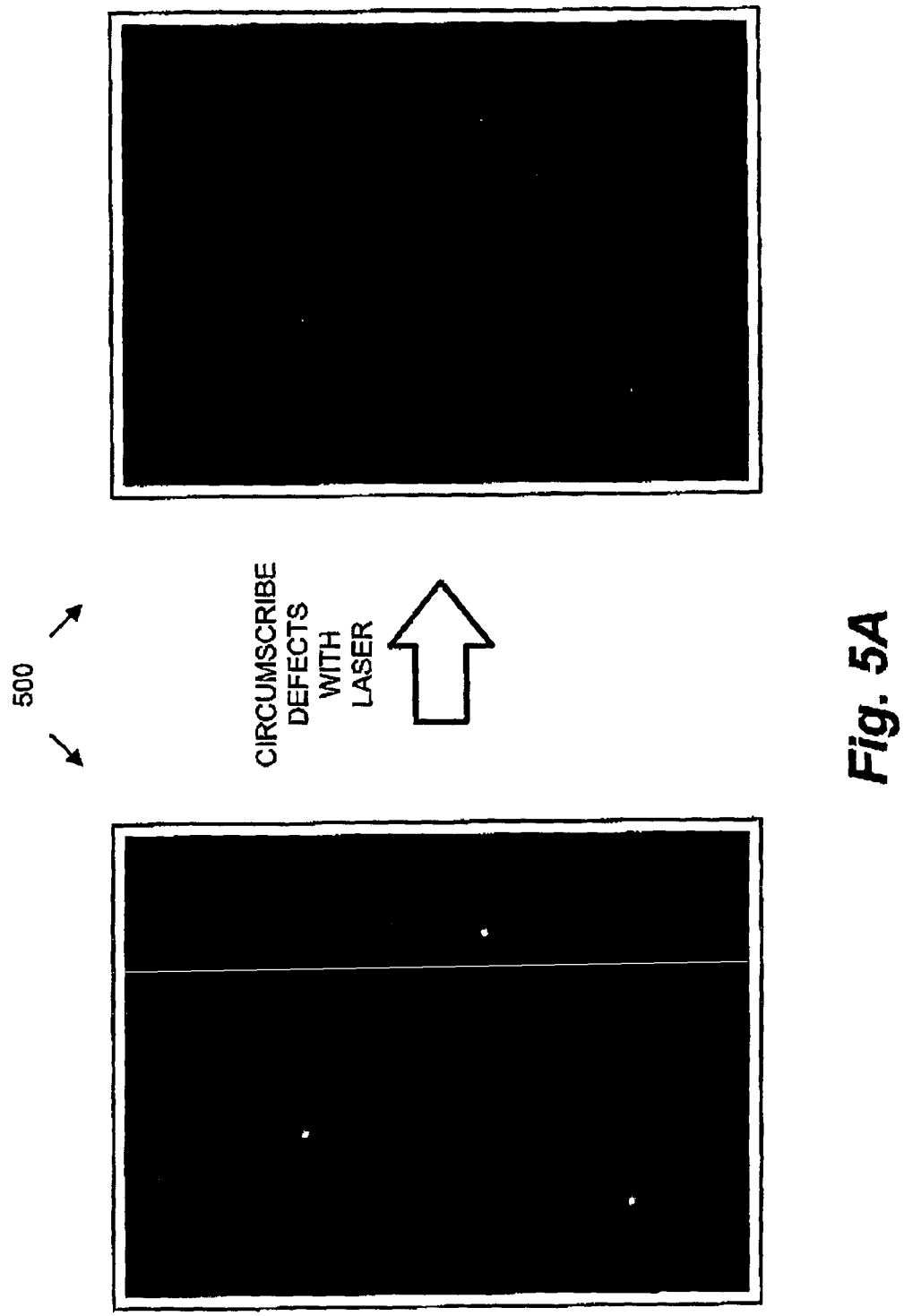
FIG. 5A depicts an electrochromic lite having three halo shorting type defects while the lite is in the colored state, before and after laser scribe to convert the halos into pinholes.

FIG. 5A depicts an electrochromic lite, 500, having three halos from shorting-type defects in the viewable area of the lite while the lite is in the colored state. The lite on the left side of FIG. 5A shows the halos prior to mitigation to make them visually smaller. The lite on the right side of FIG. 5A shows pinholes after the electrical short defects causing the three halos have been directly ablated or circumscribed to form pinholes. As depicted, and described above, the halo defects are very noticeable due to their relative size as compared to the darkly-colored remainder of the electrochromic lite. In this example, electrochromic device on lite 500 might have an area, e.g., on the order of 24 inches by 32 inches. The transparent border around the darkened area represents a perimeter portion of the lite which does not have electrochromic device on it. For example, a mask is used during deposition of the device and/or a portion of the device has been removed from the perimeter after deposition, for example, using an edge deletion, for example, mechanical or via laser ablation. The lite on the right, where the three halos have been mitigated to pinholes, exemplifies the drastic improvement in reducing the size of the visual defects from halos to pinholes. Embodiments described herein go further to eliminate the visual perception of pinholes.

In one embodiment, pinholes are obscured by application of a material to the site of the pinhole, e.g., an ink, paint or other material that covers the spot where the pinhole exists. The material may be applied, for example, via an ink jet technology. For example, when mitigating halos on an electrochromic lite, a laser mitigation device may be mounted on an X-Y stage and include an optical detection device that locates the shorting defects causing the halos. The coordinates of the defects are stored in a memory and fed to the laser tool, which then ablates material around or at the site of the defect in order to isolate the defect and create a pinhole. The same defect coordinates can then be used to supply an ink jet dispenser with the location of the defect, and thus the site of the pinhole. The ink jet dispenser then covers each pinhole with an ink, e.g., an opaque or translucent ink. The material applied to the pinholes may approximate the color of the colored EC device, or not, depending on the application. In some embodiments, covering the pinhole with the material can be done manually. Ink jet technology is particularly well-suited for this application as it can deliver a precise volume of a material in a precise area using precise coordinates.

Figure 5B:
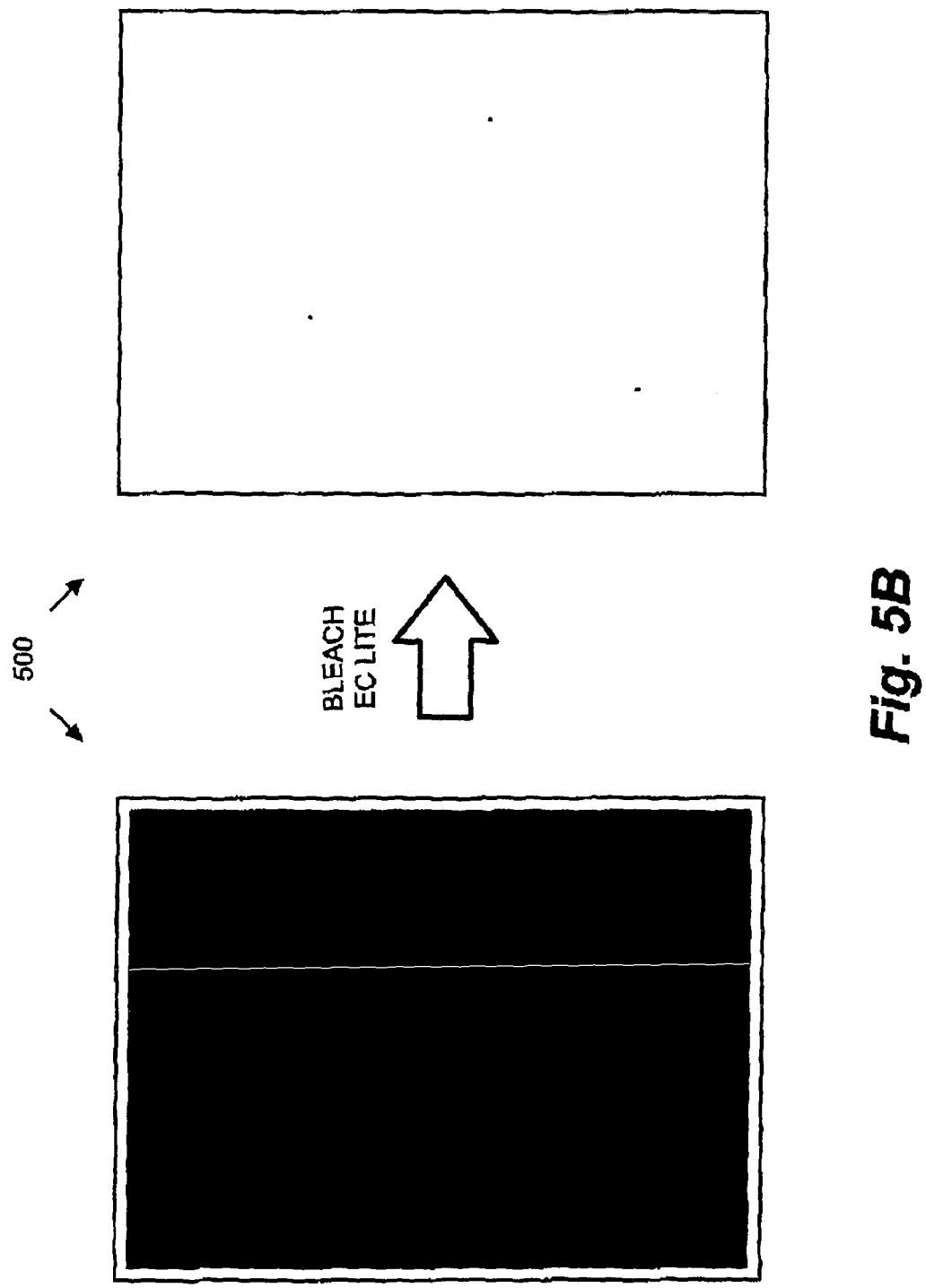
FIG. 5B depicts the electrochromic lite from FIG. 5A, in both colored and bleached states, after having the three pinholes obscured.

FIG. 5B depicts the electrochromic lite from FIG. 5A, in both colored and bleached states, after having the three pinholes obscured. The left lite is colored, showing that once the pinholes are covered, in this example with an ink that approximates the color and the transmittance (% T) of the darkened electrochromic device, they cannot be seen by the end user. The right lite shows that when the lite is bleached, the material obscuring the pinholes is very small, being visually discernible only as very small spots on the window (the dots in FIG. 5B are drawn larger than may be needed so they can be seen for the purposes of illustration only). For example, the spots of material used to obscure the pinholes may be as small as 50 micrometers in diameter. It is difficult to discern a 50 micrometer spot on a window, and not only because of its small size. Although the contrast between the spots of material and the bleached lite is still high (as between the pinholes and the colored lite), the spots are less noticeable since the incoming light diffuses and scatters around the small spots, making them hard to see by the naked eye. In embodiments where the ink spots are translucent, they are nearly imperceptible to the human eye.

The material added to the site of the pinhole may be slightly smaller (e.g., smaller by less than 1%) than the pinhole area, smaller than the pinhole area (e.g., smaller by greater than 1%), the same area or substantially the same area as the pinhole area, or larger than the pinhole area. In certain embodiments, the area of the material applied to the site of the pinhole exceeds the area of the pinhole by about 10 percent, in another embodiment by about 20 percent, and in yet another embodiment by about 50 percent. As mentioned, ink jet technology is one excellent method of applying the material, as this technology is well characterized and able to add very small amounts of material to a surface with high precision.

The material used to obscure the pinhole may be of a particular color, e.g., black, white, gray, green, brown or blue. The material used to obscure the pinholes need not be opaque. In certain embodiments, the material is translucent. The goal in this embodiment is to reduce the high contrast between the pinhole and the colored window, while also reducing the contrast between the bleached window and the material. For example, if the material's opacity (and, e.g., color) approximate the opacity of the window at 50% of its maximum absorptive state (minimum % T), it will significantly reduce the ability of an end user to visually discern the pinhole, while not completely blocking all the light emanating from the pinhole. Likewise, since the material is not as dark as the window could be in its darkest state, when the window is bleached the material will be harder to see because it doesn't contrast as greatly against the transparent window. Thus, for example, the material may simply be a gray, or gray blue or blue tinted material applied to the pinhole. Given that pinholes aren't particularly easy to see due to their size, although still visually discernible, applying even a lightly tinted material (relative to bleach state of window) to the pinholes drastically reduces the visual perception of the pinholes. This also makes the material hard to discern against the bleached window as a background. Thus a variety of colors for the material can be used to obscure the pinholes. In one embodiment the material is white. White material, whether opaque or translucent, will still block some or all of the incoming light in a pinhole, and be very hard to see when the lite is bleached. In some embodiments, the material applied to the pinholes is robust, i.e. able to withstand the heat and radiation as would be expected on an exterior window in a building.

In fact, the material need not be colored at all. In one embodiment, the material is configured to scatter the light coming through the pinhole. Thus, rather than a beam of light, which naturally passes through a transparent substrate at the pinhole and is easier to see by the end user, the light is scattered at the surface of the glass at the origin of the pinhole, thus making the pinhole harder to see. This may be achieved, e.g., by applying a material to the pinhole having small particles that scatter the light. A diffuse light emanating from the pinhole is much harder to discern by the eye than a beam of light without such scattering. Also, during bleached states, the light scattering material is also harder to discern on the bleached lite because, e.g., the particles can be transparent while still scattering the light passing through them.

In certain embodiments, the material is configured to scatter the light coming from the pinhole and the material has at least some tint (lower % T) relative to the window lite in its bleached state. For example, particles, e.g. applied as a slurry with adhesive, are applied to the pinhole. The particles can be transparent, translucent or opaque. The particles can be colored or not. In one embodiment, the particles are made of a material that has a lower % T than the electrochromic lite in its bleached state, i.e., they are translucent or transparent and colored. In another embodiment, the adhesive adds a tinting element to the material applied to the pinhole. In another embodiment, both the particles and the adhesive include a tinting element to the material added to the pinhole. In one embodiment, the material applied to the pinhole comprises only an adhesive, no particles are added. In one embodiment, the adhesive is applied as a foam or otherwise with entrapped gas bubbles. When the adhesive dries or cures, the bubbles may remain trapped in the adhesive, or may leave cavities, giving the adhesive the ability to bend or scatter light passing therethrough.

In certain embodiments, the material added to the pinhole includes or is a thermochromic material, e.g., a leuco dye, an ink, a paint, a polymer, a metal oxide (e.g. titanium dioxide, zinc oxide, vanadium oxide, mixtures thereof, and the like). The material may have one or more of the properties above such as light scattering particles, or not, but includes a thermochromic element. In one example, the material has a clear, neutral or translucent property at low temperatures, but darkens upon heating, for example, above room temperature. When the EC lite is transitioned to a colored state, e.g. to block solar heat gain on a summer day, the thermochromic material also darkens to obscure the pinholes due to the heating at the electrochromic lite due to absorption of energy. In one embodiment, where the material added to the pinhole has a thermochromic and a light scattering property, the light scattering property will aid not only in hiding the pinhole when the lite is colored, but also obscure the material when the lite is bleached.

In another embodiment, no material is added to the site of the pinhole, rather the substrate and/or the electrochromic device material are altered to make a "better" pinhole, i.e. one that is less visually discernible. That is, rather than simply circumscribing or ablating the electrical short defect and creating a pinhole, in certain embodiments, the substrate bearing the electrochromic device and/or the material in the area of the short are manipulated to create an area that has the properties of an obscured pinhole. This manipulation may or may not include circumscription of the defect. Thus electrochromic device material is purposely left in the area of the short defect, but it, along with the short defect, is converted to a non-active device area that has some ability to block or at least modify the light that would otherwise pass through the area of the pinhole without such modification (such as lower % T or scattering the light).

In one embodiment, the electrochromic stack material proximate the electrical short (which may include a particle or other defect in the EC device) is subjected to an energy source to change the properties of the material locally in order to obscure light and/or change the % T in that localized area. In one embodiment, this change in material property is performed without also circumscribing the area. In one embodiment, this material change in property is done with circumscribing, before, during or after the energy source is applied to change the properties of the device locally. For example, a laser is used to melt or otherwise change the physical and/or optical properties of the device proximate a shorting defect. The laser might have a more diffuse focus and/or less power than would be used to ablate material for creating a pinhole via circumscribing the defect. After the material is changed locally, a laser, e.g. the same laser with the focus and/or power adjusted accordingly, is used to circumscribe the area with the changed material property. In this example, the change in the material inside (and/or outside) the circumscribed area changes the optical properties of the material locally so that the pinhole is not as discernible to the user. In one embodiment, the laser energy is applied so as to convert a metal oxide to a metal or a lower oxide state, thus making the material less transmissive.

In one embodiment, the electrochromic device material is subjected to a lower energy laser than would normally be used to ablate the electrochromic device material from the pinhole. In this case, the defect may be isolated, but the electrochromic material may remain in the isolated region, e.g., as small particles which result from breaking up of the electrochromic device locally. The small particles may scatter the light passing through the pinhole (e.g. as described above).

In another embodiment, the circumscription is performed to isolate a shorting defect. Then, the material inside the pinhole formed by the circumscription is subjected to an energy source to, e.g., melt it so that it fills the area of the shorting defect and also at least an ablation circle (or other shape) so that light that would otherwise pass through at the site of the pinhole must also pass through the material with the changed properties and thus will have, e.g., lower % T and/or be scattered or diffuse so that it is less noticeable to the end user.

In one embodiment, a shorting defect, rather than being circumscribed or ablated directly with a laser, is treated with a more diffuse energy source, such as a laser that is less focused and/or has less power. The material proximate the short, i.e. the EC device stack including at least the top transparent electrode, is made non-functional due to the energy application. For example, the device is melted locally so that there is material mixing and the device is no longer functional in the area proximate the short defect. There is no electrical short thereafter, i.e., there is a "dead zone" created where the electrical short once existed. This dead zone is an area where the material of the EC device still exists, but not in a functional form as in the bulk of the EC device. The material may be, e.g., melted to form small beads or uneven surface that diffuse the light passing through the substrate in the area. When the EC device is colored, the area where the material was changed is hard to discern because it is small (on the order of the size regime of a pinhole), but the transformed EC device material in that area, e.g., scatters the light that would otherwise pass through without being scattered or diffused.

In another embodiment, the energy source is configured and the energy applied, such that the chemistry of the EC material in the area proximate the short defect is changed so that the material is permanently tinted and/or opaque. For example, many electrochromic materials require a particular oxidation state and/or stoichiometry of materials (e.g. metal oxide to alkali metal cation) to be transparent. If heated to the proper temperature, oxygen can be driven off, cations can be driven off and/or made immobile, and/or stoichiometries changed in order to permanently change the EC material to one that has a lower % T than the bulk EC device in the bleached state, be it transparent, translucent or opaque (having reflective and/or absorptive properties).

Thus as described above, one may modify the morphology of the EC material, the chemistry, etc. in order to create a dead zone in the EC device that results in a less visually discernible or completely obscured pinhole defect. In one embodiment, obscuring a pinhole by application of a material as described above is used in combination with modifying the EC device material proximate a shorting defect in order to effectively eliminate any visually discernible pinholes in an EC lite.

Thus far, the description has focused on applying a material to the pinhole to obscure it in some fashion and/or to modify the EC device material proximate an electrical short defect in order to obscure pinholes or make less visually discernible pinholes. One might carry out these operations when the EC device on the lite is available for direct application of the obscuring material and/or when an energy source can be applied to the EC device material without any intervening physical structure. For example, during fabrication of an EC lite, the lite is tested for defects, any halos mitigated to form pinholes and thus the pinholes can be obscured using one or more methods described above, before the EC lite is incorporated into an IGU or laminated with another lite (e.g., where the EC device is within the laminate structure). But, if the EC lite is already incorporated into an IGU, where the EC device is on a surface inside the sealed space of the IGU, or the EC lite is incorporated into a laminate structure, then the surface bearing the EC device cannot be directly contacted in order to apply an obscuring material to the pinholes and/or to apply an energy source to change the properties of the EC device locally in order to produce a less visually discernible pinhole. Embodiments described herein address such situations.

FIG. 6A depicts an IGU assembly, 600, having a first substantially transparent substrate, 605, a separator, 610, and a second substantially transparent substrate, 615. On the left of FIG. 6A is shown an exploded view of IGU 600 to indicate how the components are assembled. Also indicated are industry recognized numbers for each of the four substrate surfaces for a dual pane IGU construct. Surface 1 is the outer surface of the first lite, 605; surface 1 is the surface that is typically on the outside of a building after the EC window is installed. Surface 2 is the other side of the first lite, 605; that is, the surface of 605 that is inside the IGU after the IGU is assembled. In this example, the EC device (not shown) is fabricated on surface 2 of lite 605. Surface 3 is the surface of lite 615 inside the IGU, facing surface 2. Surface 4 is the surface of lite 615 outside the IGU. When the three components are combined, where separator 610 is sandwiched in between and registered with substrates 605 and 615, IGU 600 is formed. IGU 600 has an associated interior space defined by the faces of the substrates in contact with the separator 610 and the interior surfaces of the separator 610. Separator 610 is typically a sealing separator, that is, includes a spacer and sealing component (e.g. a polymeric adhesive such as polyisobutylene (PIB)) between the spacer and each substrate where they adjoin in order to hermetically seal the interior region and thus protect the interior from moisture and the like. The spacer and PIB collectively define a primary seal. A typical IGU will also include a secondary seal, such as a polymeric sealant applied around the outside the primary seal, around the periphery of the spacer, but substantially in between the glass panes.

Substantially transparent substrates are typically used for EC lites. "Substantially transparent substrates" are of substantially transparent material, for example, glass or Plexiglas. The substrates of the EC lites of an IGU need not be made of the same material, for example, one substrate may be plastic while the other is glass. In another example, one substrate may be thinner than the other substrate, for example, the substrate that would face the interior of a structure, which is not exposed to the environment, may be thinner than the substrate that would face the exterior of the structure (e.g., building). In addition to an EC device coating, a substantially transparent substrate may further include a low emissivity coating, a UV and/or infrared (IR) absorber, and/or, a UV and/or IR reflective layer. The substrate type, e.g. glass or polymeric, and any additional coatings, are taken into account when considering the following embodiments. For example, polymeric substrates may or may not be transparent to laser radiation or other energy source used to obscure pinholes. This is described in more detail below.

Figure 6B:
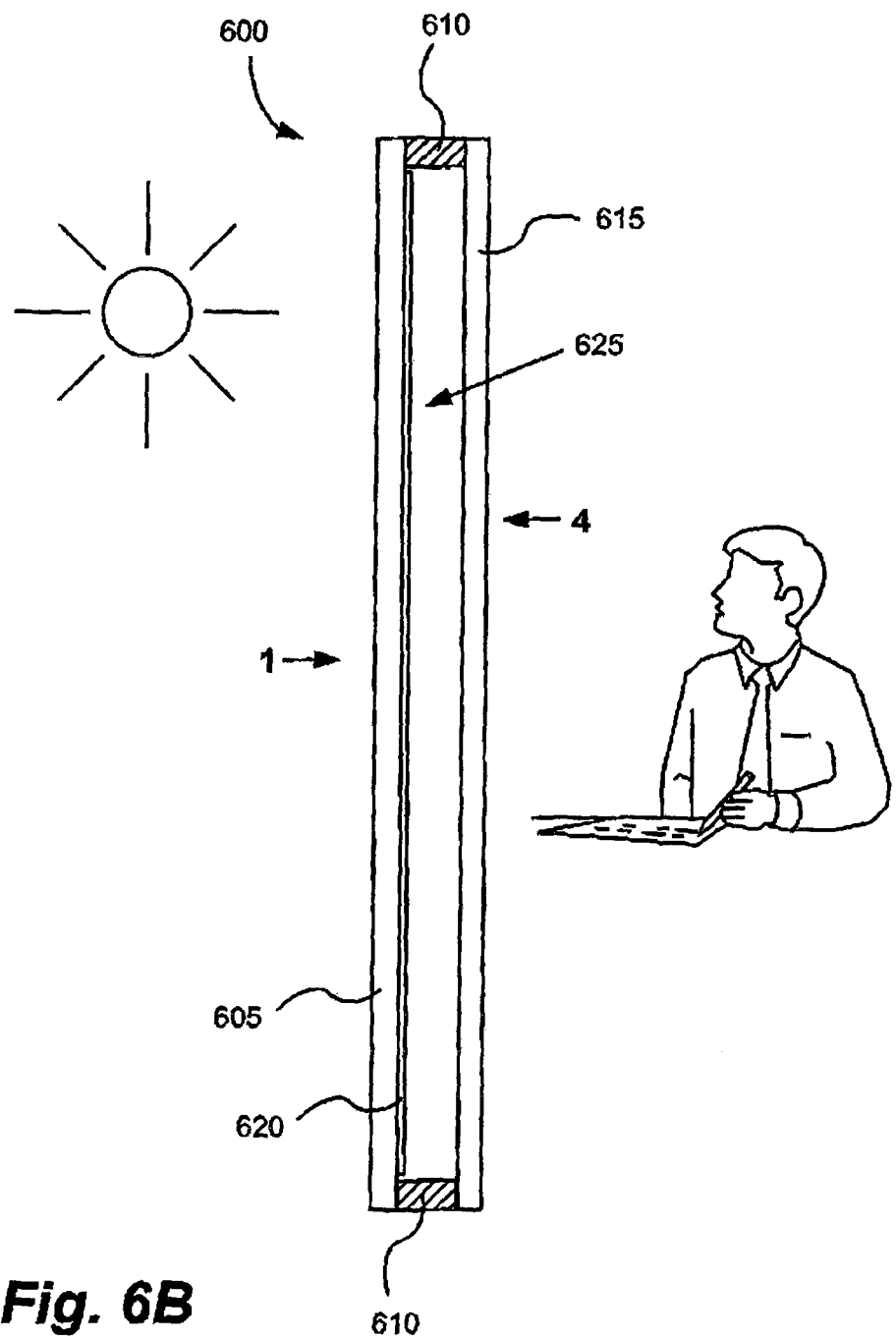
FIG. 6B depicts a cross-section of the window assembly described in relation to FIG. 6A.

FIG. 6B depicts a cross-section of IGU 600 as described in relation to FIG. 6A. FIG. 6B shows an EC device coating, 620, on surface 2 of the IGU. Surfaces 1 and 4 are indicated for reference. The interior region of IGU 600 is typically, but not necessarily, charged with an inert gas such as argon or nitrogen. Typically, the interior space is substantially moisture free, that is, having a moisture content of less than about <0.1 ppm. Preferably, the interior space would require at least about −40° C. to reach the dew point (condensation of water vapor from the interior space). Once the EC device is hermetically sealed in the IGU, direct application of an obscuring material is not possible (on surface 2 but of course, surface 1 would still be accessible). Also, methods described above that include application of laser light must be performed through either substrate 605 or 615, rather than directly to EC device 620. Further embodiments for obscuring pinholes, methods performed after IGU fabrication or lamination, are described in more detail below. Various embodiments take advantage of, and/or anticipate the construction of an IGU and/or laminate in order to achieve these ends.

Figure 6C:
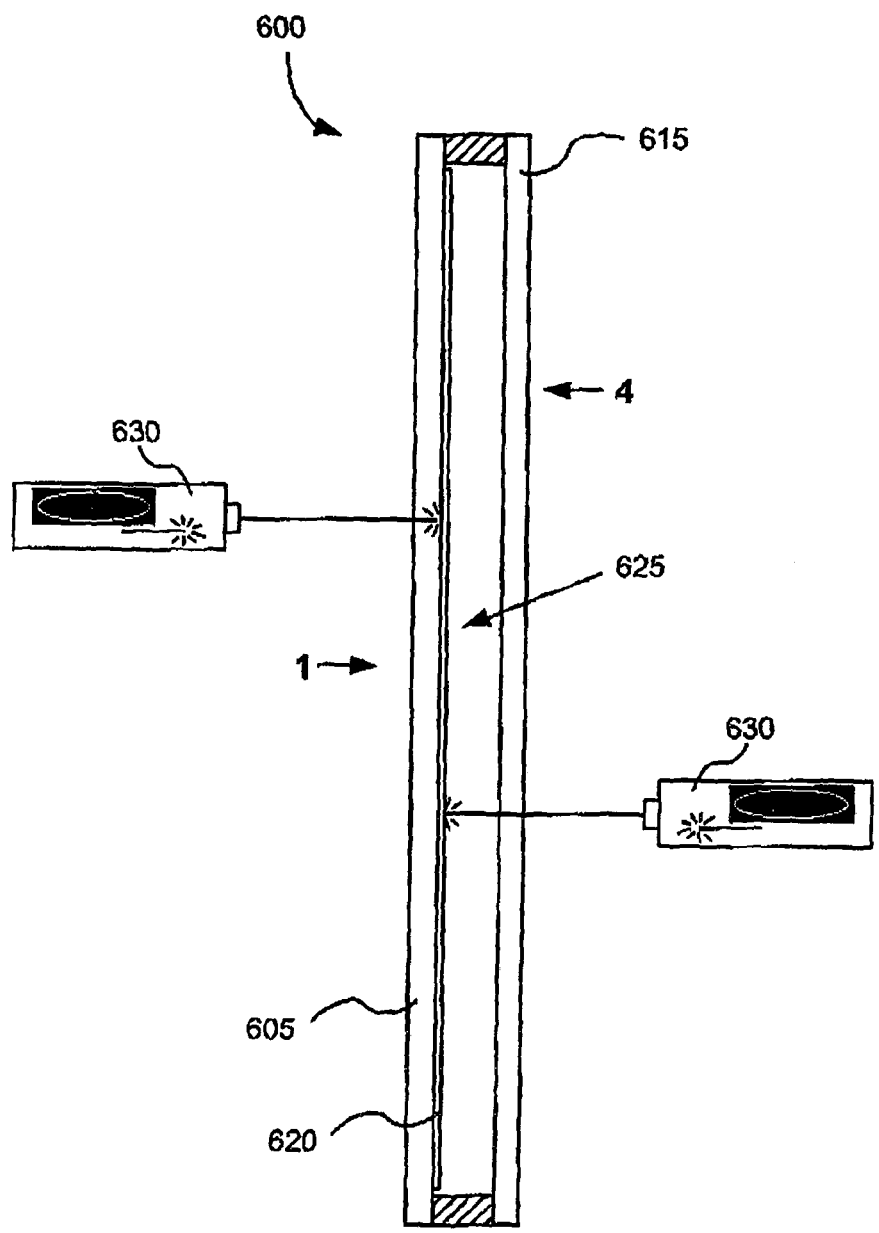
FIG. 6C depicts aspects of methods described herein in relation to the cross-section depicted in FIG. 6B.

Referring to FIG. 6C, IGU 600 is depicted. Methods described above for obscuring a pinhole by changing the nature of the EC material using an energy source, e.g. a laser, can be performed through substrate 605 and/or substrate 615. For example, if the substrates are made of a material that is transparent to the laser energy, then the laser can be used to, e.g., change the morphology and/or chemistry of the EC material of coating 620 by directing the laser beam through the substrates and onto the EC coating. An IGU having a reflective, absorptive, or other coating(s) on one lite or the other must be accounted for when applying the energy to affect the desired result.

Additionally, as described above but e.g. through substrate 605 and/or substrate 615, substrate 605 may be modified on surface 2, e.g., at the bottom of a hole from ablation of a pinhole, where the substrate 605 is modified to scatter or diffuse the light that would otherwise pass through the hole without such scattering. In one embodiment, the substrate 605 is modified below surface 2, proximate the pinhole, in order to scatter and/or obscure light that otherwise would pass through the pinhole above it. That is, using the correct focal length, power, etc., an energy source, such as a laser, is used to melt, ablate, change the morphology of the substrate 605, e.g., glass, just below surface 2, inside the substrate 605, proximate the pinhole. For example, the laser may be applied through surface 1 and not to the coating 620 itself, but to a position below surface 2. For example, the pinhole is created with a first laser pulse, and then a second laser pulse is used to form one or more bubbles or other features just below surface 2, proximate the pinhole. In another example, the pinhole is created by a laser through substrate 615, and the change in morphology just below surface 2 is made from another laser through substrate 605.

Though an EC device may be sealed inside an IGU or laminate, embodiments to obscure pinholes are not limited to those where an energy source is used to modify an existing material in the EC device and/or substrate to scatter light or otherwise obscure a pinhole and/or create a less visually discernible pinhole. That is, in certain embodiments material can be added to the EC device surface to obscure a pinhole, even after a lamination or IGU is constructed. Exemplary embodiments are described below.

Before describing embodiments where material is used on the EC device to obscure a pinhole, after lamination and/or IGU formation, it is important to describe that in certain embodiments, material is added to surfaces 4, 3 and/or 1, and/or surfaces 4, 3 and/or 1 are modified morphologically, e.g., to scatter light, in addition to, or alternatively to, such modifications on surface 2. Such modifications are within the scope of the embodiments disclosed herein, although it is preferable to modify at or near surface 2 so as to minimize the possibility that a pinhole will be seen from viewing the window at an angle. That is, modifications at surfaces other than surface 2 may obscure a pinhole from certain, but not all viewing angles, and are thus less preferred. For example, surface treatments will have to affect a larger area in order to obscure a pinhole on surface 2 at wider viewing angles, and thus the larger area might be more noticeable and therefore unattractive to the end user.

Referring again to FIG. 6C, in certain embodiments, material can be added to the EC device surface to obscure a pinhole, even after an IGU 600 is constructed. These methods can be performed, e.g., in the factory after IGU formation and testing, in the field after installation, or after installation the IGU can be removed, sent to a facility for mitigation and reinstalled in the field.

In one embodiment, a reagent gas is introduced into the IGU 600, e.g. via a breather tube or other similar gas exchange device. In one embodiment, the seal 610 is penetrated in order to introduce the reagent gas. Once the void space 625 is occupied by the reagent gas, one or more lasers 630 are used to focus an energy pulse at the site of the pinhole. The laser (or other directed energy) supplies sufficient energy to transform the reagent gas into a solid material at the site of the pinhole, obscuring the pinhole. For example, the gas may be a monomer. Laser, ultraviolet or other energy is directed at the site of a pinhole in order to polymerize the monomeric gas selectively only at the site of the pinhole. The pinhole is then obscured by the polymeric material. This process is repeated until all pinholes are obscured.

In one embodiment, while the IGU is filled with a reagent gas, e.g. a monomeric reagent that is polymerized upon exposure to an energy source, the energy source is applied via the pinholes while the EC device is in a tinted state. That is, the energy source is selectively introduced into the IGU cavity by tinting the EC device and using the pinholes as access ports for the energy, e.g., a light source, UV lite, etc. The energy is directed at surface 1 and, since the EC device is tinted, the energy passes only through the pinholes or only in sufficient quantity through the pinholes to convert the monomer to a polymer selectively at the site of each pinhole. The polymerized monomer at the site of each pinhole prevents further polymerization as the energy is blocked by the polymerized material at the site of each pinhole. This embodiment has the advantage that all the pinholes are selectively concealed in a single operation of applying the energy. The pinholes, by virtue of not coloring, provide means for a highly selective polymerization only at the sites of the pinholes when the EC device is tinted. In certain embodiments, e.g. on very large windows, it may be more convenient to apply the energy to smaller areas of surface 1, e.g. passing a wand device that emits the energy locally over the window, until all the pinholes are obscured. Detection of pinhole concealment may be done visually, but can also be performed using an optical measurement device, e.g., where a specific level of concealment is desired. For example, the level of polymerization at a pinhole can be measured as a function of the amount of light passing through the pinhole as the energy is applied to the pinhole. As the polymerization takes place, the light is progressively blocked from passing through the pinhole. When a sufficient level of light is blocked the energy application can be terminated. In one embodiment, the polymerization is self-limiting, as the energy required for the polymerization is diminished by the polymerization blocking the energy from entering the IGU cavity. In such embodiments, the visual endpoint for pinhole concealment may be obviated. In one embodiment, the polymerization or other reaction to conceal the pinholes selectively is timed such that the desired level of concealment is achieved, e.g. either empirically or by knowing the reaction kinetics, by applying the energy for a specified time period.

After the pinhole(s) are obscured, the reagent gas is flushed from the IGU void space and replaced with argon or suitable inert gas and any apertures are sealed to reestablish the integrity of the IGU seal. These embodiments have distinct advantages. For example, a large IGU, e.g., in a prominent display, is installed in the field. The IGU would be very expensive to replace. After a number of years, the IGU forms a halo in the viewable area. The halo is very distracting to end users. Rather than uninstalling the IGU, a repair technician comes to the site. A portable halo mitigation device is used to identify the shorting defect causing the halo and mitigate the halo, e.g., using a laser to form a pinhole. Such halo portable mitigation technology is described in U.S. provisional patent application, Ser. No. 61/534,712, filed Sep. 14, 2011, and titled "PORTABLE DEFECT MITIGATOR FOR ELECTROCHROMIC WINDOWS," naming Robert T. Rozbicki as inventor, which is herein incorporated by reference. After the technician transforms the halo to a pinhole, the end user may be satisfied with the result. Regardless, the technician may access the IGU void space, via a pre-installed breather tube, or penetrating the IGU seal. The argon is flushed from the IGU using a monomeric gas. While the gas resides in the IGU, the technician again applies energy, e.g. using the laser of the portable mitigation device or a UV source, to the site of the pinhole in order to selectively polymerize the monomeric gas at the site of the pinhole, thus obscuring the pinhole. The monomeric gas is flushed from the IGU with argon and the seal reestablished. The repair of the halo is complete and there are no visually discernible defects in the window. This result has been achieved without having to remove the EC window from its installation, saving time, money and resources, while maximizing user enjoyment of the window.

Portable defect mitigation devices as described above have the advantage of having optical detection mechanisms to locate visual defects, and convert them to pinholes via a mitigation mechanism, such as a laser. Also, such portable defect mitigation devices may include a memory, so that the locations of the pinholes can be stored in the memory. This location data can be further used for pinhole concealment as described herein. The optical detection mechanism may be used to locate an optical defect and "better pinholes" be made via the mitigation mechanism.

Figure 7:
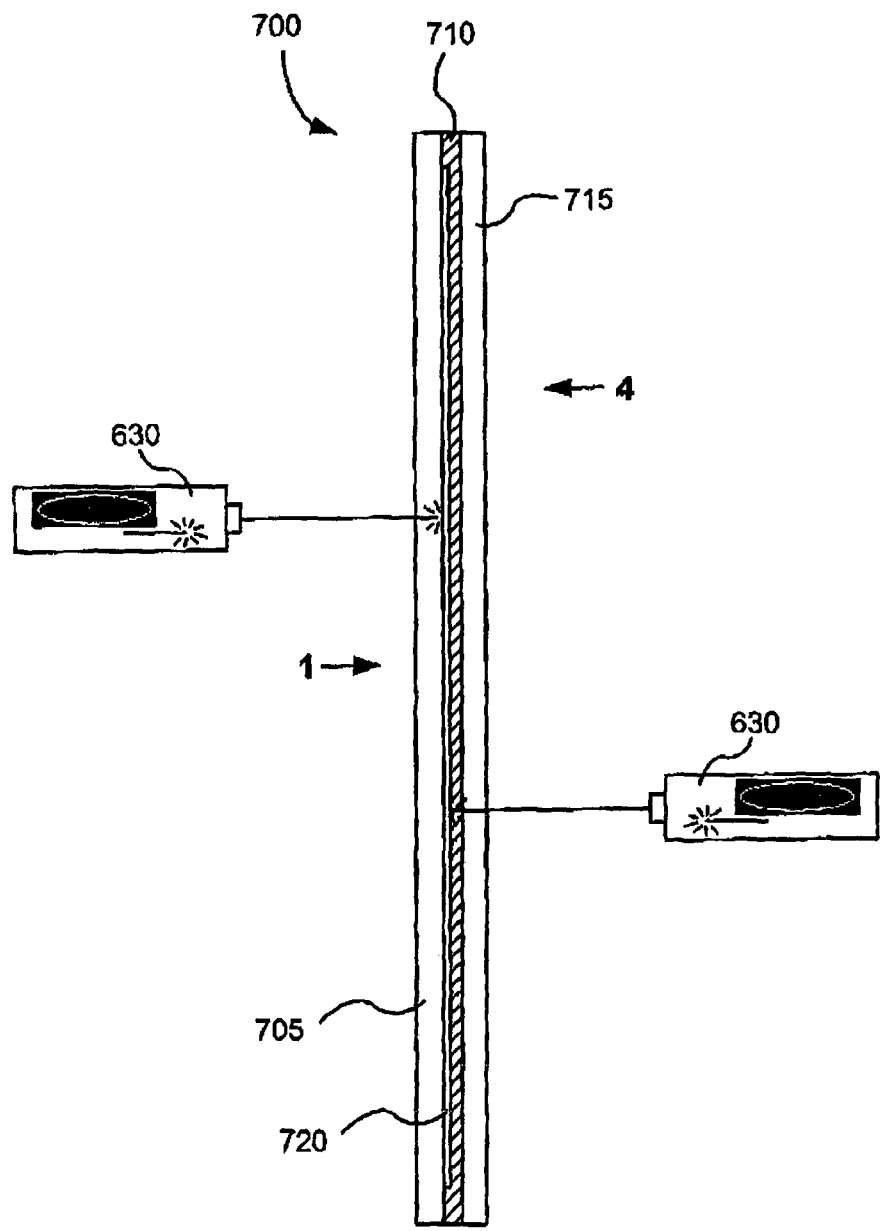
FIG. 7 depicts a cross section of a laminated electrochromic lite in relation to methods described herein.

Referring to FIG. 7, the methods described above can be performed on a laminated EC device as well. FIG. 7 depicts an EC device laminate, 700, which includes substrate, 705, having an EC coating, 720, thereon. Another substrate, 715, is laminated to substrate 705 via a transparent adhesive, 710. Adhesive 710 is in contact with the EC device in this example, which serves not only to hold the glass substrates together, but also as a protective covering for EC device 720. In the laminate structure, there is no void space as in IGU 600. Nevertheless, energy can be directed to surface 2, just below surface 2, etc. as described above through substrates 705 and 715 (provided the lamination adhesive will tolerate/pass the energy). In one embodiment, a halo is mitigated from an EC device laminate 700 via directed energy through surface 1. After the halo is mitigated to form a corresponding pinhole, the pinhole is obscured by application of energy to the adhesive lamination material in order to selectively change its properties proximate the pinhole in order to obscure the pinhole. For example, laser energy may be used to selectively burn, darken, or otherwise change the optical properties of the adhesive proximate the pinhole.

Although the foregoing embodiments have been described in some detail to facilitate understanding, the described embodiments are to be considered illustrative and not limiting. It will be apparent to one of ordinary skill in the art that certain changes and modifications can be practiced without avoiding the scope of the embodiments disclosed herein.

The invention claimed is:

1. A method of mitigating a pinhole defect, the method comprising:
   a. providing an electrochromic lite comprising an electrochromic device on a substrate;
   b. identifying a site of the pinhole defect in the electrochromic device; and
   c. applying a material to the site of the pinhole defect, wherein the material has a lower transmittance than the substrate and the material is applied via an ink jet dispenser, wherein the material comprises at least one of a leuco dye, an ink, a paint, a polymer and a metal oxide.

2. The method of claim 1, wherein the material has an opacity of about 50% of the maximum transmittance of the electrochromic device.

3. The method of claim 1, wherein the material has a color selected from a group consisting of white, black, gray, green, brown and blue.

4. The method of claim 1, wherein the metal oxide includes at least one of titanium dioxide, zinc oxide or vanadium oxide.

5. The method of claim 1, wherein b. comprises
identifying coordinates of a short-related defect,
mitigating the short-related defect via laser circumscription to form the pinhole defect, and
identifying the site of the pinhole defect based on the coordinates of the short-related defect.

6. The method of claim 1, wherein the pinhole defect is created by laser circumscription of a short-related defect in the electrochromic device.

7. The method of claim 1, wherein the metal oxide is thermochromic.

8. A method of mitigating a pinhole defect in an electrochromic device on a substrate that is incorporated into an IGU, the method comprising:
   a. providing an electrochromic lite having the electrochromic device on the substrate;
   b. identifying a site of the pinhole defect in the electrochromic device; and
   c. altering the site of the pinhole defect in order to lower the light transmittance at the site of the pinhole defect by:
      (1) introducing a reagent gas into the interior volume of the IGU; and
      (2) applying energy from an energy source selectively at the site of the pinhole defect to transform the reagent gas into a solid material locally at the site of the pinhole defect.

9. The method of claim 8, wherein the energy source is a laser or an ultraviolet light source.

10. The method of claim 8, wherein the reagent gas is a monomer which is polymerized at the site of the pinhole defect upon application of the energy source.

11. The method of claim 8, wherein a and b. are repeated until substantially all pinhole defects in the electrochromic device are obscured.

12. The method of claim 11, wherein the reagent gas is flushed from the IGU after substantially all pinhole defects in the electrochromic device are obscured.

13. The method of claim 8, wherein the energy source is applied via the pinhole while the electrochromic device is in a tinted state.

14. The method of claim 13, wherein the energy source is applied via the pinhole while the electrochromic device is in a tinted state, and wherein substantially all pinhole defects in the electrochromic device are obscured in a single application of the energy source.

15. The method of claim 14, wherein the reagent gas is flushed from the IGU after substantially all pinhole defects in the electrochromic device are obscured.

16. The method of claim 15, wherein an inert gas is used to flush the reagent gas from the IGU.

17. A method of mitigating a pinhole defect in an electrochromic device on a substrate that has been incorporated into a laminate, the method comprising:
   identifying a site of the pinhole defect in the electrochromic device; and
   applying energy of a laser proximate an area of the pinhole defect in an adhesive of the laminate; wherein the energy of the laser changes transmittance of the adhesive proximate the pinhole defect.

18. A method of mitigating a pinhole defect, the method comprising:
   a. providing an electrochromic lite comprising an electrochromic device on a substrate;
   b. identifying a site of the pinhole defect in the electrochromic device; and
   c. applying a material to the site of the pinhole defect, wherein the material has a lower transmittance than the substrate and comprises light scattering particles.

19. A method of mitigating a pinhole defect, the method comprising:
   a. providing an electrochromic lite having an electrochromic device on a substrate;
   b. identifying a site of the pinhole defect in the electrochromic device; and
   c. applying a material to the site of the pinhole defect, wherein the material has a lower transmittance than the substrate and comprises light scattering particles, wherein the material comprises a thermochromic material.

* * * * *